United States Patent
Tsuda et al.

(10) Patent No.: US 10,546,763 B2
(45) Date of Patent: Jan. 28, 2020

(54) SUBSTRATE TREATMENT METHOD AND SUBSTRATE TREATMENT DEVICE

(71) Applicant: SCREEN Holdings Co., Ltd., Kyoto (JP)

(72) Inventors: Shotaro Tsuda, Kyoto (JP); Junichi Ishii, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 71 days.

(21) Appl. No.: 15/759,545

(22) PCT Filed: Apr. 22, 2016

(86) PCT No.: PCT/JP2016/062744
§ 371 (c)(1),
(2) Date: Mar. 13, 2018

(87) PCT Pub. No.: WO2017/056540
PCT Pub. Date: Apr. 6, 2017

(65) Prior Publication Data
US 2019/0157117 A1    May 23, 2019

(30) Foreign Application Priority Data
Sep. 28, 2015  (JP) ................. 2015-189833

(51) Int. Cl.
*H01L 21/67* (2006.01)
*B08B 1/02* (2006.01)
(Continued)

(52) U.S. Cl.
CPC .......... *H01L 21/67046* (2013.01); *B08B 1/02* (2013.01); *B08B 3/022* (2013.01); *H01L 21/67051* (2013.01); *B08B 1/002* (2013.01)

(58) Field of Classification Search
None
See application file for complete search history.

(56) References Cited

U.S. PATENT DOCUMENTS

2007/0226926 A1  10/2007  Hiraoka et al. ............... 15/102
2008/0053487 A1   3/2008  Goto et al. ..................... 134/32
(Continued)

FOREIGN PATENT DOCUMENTS

JP  2007-273612 A  10/2007
JP  2009-238938 A  10/2009
(Continued)

OTHER PUBLICATIONS

International Search Report dated Jul. 12, 2016 in corresponding PCT International Application No. PCT/JP2016/062744, 3 pages.
(Continued)

*Primary Examiner* — Eric W Golightly
(74) *Attorney, Agent, or Firm* — Ostrolenk Faber LLP

(57) ABSTRACT

In parallel with a lower-side scrub cleaning step where a brush is contacted with a lower surface inclined portion of a substrate, a center-side spray cleaning step is performed where a collision position of liquid droplets with respect to an upper surface of the substrate is moved between the center of the substrate and the middle of the substrate while the liquid droplets collide with the upper surface of the substrate. Thereafter, in parallel with an upper-side scrub cleaning step where the brush is contacted with an upper surface inclined portion of the substrate, an outer circumference-side spray cleaning step is performed where the collision position of the liquid droplets with respect to the upper surface of the substrate is moved between the middle of the substrate and the outer circumference of the substrate while the liquid droplets collide with the upper surface of the substrate.

14 Claims, 5 Drawing Sheets

(51) Int. Cl.
*B08B 3/02* (2006.01)
*B08B 1/00* (2006.01)

(56) References Cited

U.S. PATENT DOCUMENTS

2009/0025763 A1  1/2009  Nonomura et al. .......... 134/198
2010/0108095 A1  5/2010  Mouri et al. ...................... 134/6

FOREIGN PATENT DOCUMENTS

| JP | 2012-094602 A | 5/2012 |
| KR | 10-2010-0050397 | 5/2010 |
| TW | 200822194 A | 5/2008 |
| TW | 200926274 A | 6/2009 |

OTHER PUBLICATIONS

Written Opinion dated Jul. 12, 2016 in corresponding PCT International Application No. PCT/JP2016/062744, 3 pages.
International Preliminary Report on Patentability (Chapter I) with a Notification from the International Bureau Form PCT/IB/326 for International Application No. PCT/JP2016/062744 dated Apr. 12, 2018.
English translation of the International Preliminary Report on Patentability (Chapter I) with a Notification from the International Bureau Form PCT/IB/338 International Application No. PCT/JP2016/062744 dated Apr. 12, 2018.

SUBSTRATE TREATMENT METHOD AND SUBSTRATE TREATMENT DEVICE

CROSS-REFERENCE TO RELATED APPLICATIONS

The present application is a 35 U.S.C. §§ 371 national phase conversion of PCT/JP2016/062744, filed Apr. 22, 2016, which claims priority to Japanese Patent Application No. 2015-189833, filed Sep. 28, 2015, the contents of both of which are incorporated herein by reference. The PCT International Application was published in the Japanese language.

TECHNICAL FIELD

The present invention relates to a substrate processing method and a substrate processing apparatus that process a substrate. Substrates to be processed include, for example, semiconductor wafers, substrates for liquid crystal displays, substrates for plasma displays, substrates for FEDs (field emission displays), substrates for optical disks, substrates for magnetic disks, substrates for magneto-optical disks, substrates for photomasks, ceramic substrates, substrates for solar cells, etc.

BACKGROUND ART

Patent Document 1 discloses a substrate processing apparatus that cleans the outer circumferential portion of the substrate using a brush. This substrate processing apparatus includes a spin chuck that rotates the substrate about a rotation axis passing through the central portion of the substrate while holding the substrate horizontally and a brush moving mechanism that presses a drum-shaped brush against the outer circumference of the substrate held by the spin chuck. The brush is pressed against the lower surface outer circumferential portion of the rotating substrate, and thereafter pressed against the upper surface outer circumferential portion of the rotating substrate.

PRIOR ART DOCUMENT

Patent Document

Patent Document 1: JP 2007-273612 A

SUMMARY OF THE INVENTION

Problem(s) to be Solved by the Invention

In the substrate processing apparatus of Patent Document 1, the brush is pressed against the outer circumferential portion of the substrate (so-called bevel portion), it is possible to physically remove the foreign matter adhered to the outer circumferential portion of the substrate. However, in the configuration of Patent Document 1, it is impossible to clean the upper surface of the substrate physically.

The present inventors have been considering to physically clean not only an outer circumferential portion of a substrate, but also an upper surface of the substrate by causing a plurality of liquid droplets to collide with the upper surface of the substrate while bringing a brush into contact with an outer circumferential portion of the substrate. In this case, since the outer circumferential portion of the substrate and the upper surface of the substrate are cleaned at the same time, cleaning time of the substrate can be shortened while increasing the cleanliness of the substrate. However, the present inventors have found that the cleanliness of the substrate would be sufficiently enhanced merely by simultaneously cleaning the outer circumferential portion and the upper surface of the substrate.

Thus, one object of the present invention is to increase the cleanliness of the substrate while suppressing an increase in cleaning time of the substrate.

Means for Solving the Problem

A preferred embodiment of the present invention provides a substrate processing method including a substrate rotating step of rotating a substrate about a vertical rotation axis passing through the substrate while holding the substrate horizontally, a lower side scrub cleaning step of causing a brush to come into contact with a lower surface inclined portion of the substrate, in parallel with the substrate rotating step, a center side spray cleaning step of moving a collision position of a plurality of liquid droplets with respect to an upper surface of the substrate between a center of the substrate and a middle of the substrate while causing the plurality of liquid droplets to collide with the upper surface of the substrate, in parallel with the lower side scrub cleaning step, an upper side scrub cleaning step of causing the brush to come into contact with an upper surface inclined portion of the substrate, after the lower side scrub cleaning step and in parallel with the substrate rotating step, and an outer circumference side spray cleaning step of moving the collision position of the plurality of liquid droplets with respect to the upper surface of the substrate between the middle of the substrate and an outer circumference of the substrate while causing the plurality of liquid droplets to collide with the upper surface of the substrate, in parallel with the upper side scrub cleaning step.

According to this method, the brush is brought into contact with the lower surface inclined portion of the rotating substrate. Thus, the brush is rubbed on the entire circumference of the lower surface of the substrate. Foreign matters such as particles are peeled off from the substrate by the physical force from the brush. In parallel with cleaning of the lower surface inclined portion of the substrate, the plurality of liquid droplets collide with a region within the upper surface of the substrate from the center of the substrate to the middle of the substrate. Foreign matters such as particles are peeled off from the substrate by physical force due to collision of the liquid droplets.

After the lower surface inclined portion of the substrate is cleaned, the brush is brought into contact with the upper surface inclined portion of the rotating substrate. Thus, the brush is rubbed on the entire circumference of the upper surface of the substrate. In parallel with the cleaning of the upper surface inclined portion of the substrate, the plurality of liquid droplets collide with a region within the upper surface of the substrate from the middle of the substrate to the outer circumference of the substrate. In this way, in parallel with the physical cleaning of the outer circumferential portion of the substrate, the upper surface of the substrate is cleaned physically, and thus it is possible to increase the cleanliness of the substrate while suppressing an increase in cleaning time of the substrate.

When the brush is in contact with the lower surface inclined portion of the rotating substrate, flying substances such as particles and liquid droplets scatter downwardly from the brush toward the rotation axis of the substrate below the substrate (see FIG. 6). These flying substances scatter in a direction away from the substrate, and thus are unlikely to adhere to the substrate. On the other hand, when the brush is in contact with the upper surface inclined portion of the rotating substrate, flying substances scattered from the brush are likely to fall on the upper surface of the substrate (see FIG. 7). Therefore, flying substances are likely to adhere to the upper surface of the substrate, in particular, the upper surface outer circumferential portion of the substrate.

Region on which flying substances tend to fall, that is, region in the upper surface of the substrate from the middle of the substrate to the outer circumference of the substrate is cleaned with the plurality of liquid droplets when the brush is in contact with the upper surface inclined portion of the substrate. Thus, flying substances adhered to the upper surface of the substrate can be immediately removed. In this way, not only foreign matter adhering to the upper surface outer circumferential portion of the upper surface of the substrate, but also flying substances scattered from the brush to the upper surface outer circumferential portion of the upper surface of the substrate can be removed with the plurality of liquid droplets, and thus the cleanliness of the substrate can be enhanced.

In the preferred embodiment, at least one of the following features may be added to the substrate processing method.

Each of the center side spray cleaning step and the outer circumference side spray cleaning step is a step of moving the collision position of the plurality of liquid droplets with respect to the upper surface of the substrate only to an outer circumference side of the substrate. the center side spray cleaning step is a step of conducting one or more times a step of moving the collision position of the plurality of liquid droplets with respect to the upper surface of the substrate from the center of the substrate to the middle of the substrate. Similarly, the outer circumference side spray cleaning step is a step of conducting one or more times a step of moving the collision position of the plurality of liquid droplets with respect to the upper surface of the substrate from the middle of the substrate to the outer circumference of the substrate.

According to this method, the collision position of the plurality of liquid drops with respect to the upper surface of the substrate moves only to the outer circumference side of the substrate, and thus a force to move foreign matters on the substrate outward is generated. Therefore, foreign matters on the substrate are urged to move outward along the upper surface of the substrate. As a result, foreign matters can be efficiently removed from the substrate and the cleanliness of the substrate can be further enhanced.

The substrate processing method further includes an upper rinse liquid supplying step of discharging a rinse liquid toward an upper surface central portion of the substrate in parallel with the center side spray cleaning step and the outer circumference side spray cleaning step.

According to this method, the rinse liquid is discharged toward the upper surface central portion of the rotating substrate. The rinse liquid that has landed on the upper surface of the substrate flows outward along the upper surface of the substrate. Foreign matters peeled off from the upper surface of the substrate due to the collision of the plurality of liquid droplets are urged to move outward by the rinse liquid flowing outward. Thus, foreign matters can be efficiently removed from the substrate and the cleanliness of the substrate can be further enhanced.

The outer circumference side spray cleaning step is a step of moving the collision position of the plurality of liquid droplets with respect to the upper surface of the substrate between the middle of the substrate and the outer circumference of the substrate inside a region in which the upper surface of the substrate and the brush contact with each other.

According to this method, the collision position of the plurality of liquid drops with respect to the upper surface of the substrate moves inside the region in which the upper surface of the substrate and the brush contact with each other. That is, the scrub cleaning (cleaning with a brush) and spray cleaning (cleaning by a collision of the liquid droplets) is carried out in separate regions of the substrate. In this way, the scrub cleaning and the spray cleaning are not performed to the same region of the substrate, so that cleaning time of the substrate can be shortened.

Another preferred embodiment of the present invention provides a substrate processing apparatus including a substrate holding unit that rotates a substrate about a vertical rotation axis passing through the substrate while holding the substrate horizontally, a brush to be pressed against the substrate, a brush moving mechanism that moves the brush to a plurality of positions including a lower contact position in which the brush contacts with a lower surface inclined portion of the substrate and an upper contact position in which the brush contacts with an upper surface inclined portion of the substrate, a nozzle that forms a plurality of liquid droplets that collide with an upper surface of the substrate, a nozzle moving mechanism that moves a collision position of the plurality of liquid droplets with respect to the upper surface of the substrate between a center of the substrate and an outer circumference of the substrate, and a controller that controls the substrate holding unit, the brush moving mechanism and the nozzle moving mechanism.

The controller conducts a substrate rotating step of causing the substrate holding unit to hold the substrate horizontally and to rotate the substrate about the rotation axis, a lower side scrub cleaning step of causing the brush moving mechanism to bring the brush into contact with the lower surface inclined portion of the substrate, in parallel with the substrate rotating step, a center side spray cleaning step of causing the nozzle moving mechanism to move the collision position of the plurality of liquid droplets with respect to the upper surface of the substrate between the center of the substrate and a middle of the substrate while causing the plurality of liquid droplets to collide with the upper surface of the substrate, in parallel with the lower side scrub cleaning step, an upper side scrub cleaning step of causing the brush moving mechanism to bring the brush to come into contact with the upper surface inclined portion of the substrate, after the lower side scrub cleaning step and in parallel with the substrate rotating step, and an outer circumference side spray cleaning step of causing the nozzle moving mechanism to move the collision position of the plurality of liquid droplets with respect to the upper surface of the substrate between the middle of the substrate and the outer circumference of the substrate while causing the plurality of liquid droplets to collide with the upper surface of the substrate, in parallel with the upper side scrub cleaning step. According to this configuration, it is possible to achieve the effect described above.

In the preferred embodiment, at least one of the following features may be added to the substrate processing apparatus.

The controller moves the collision position of the plurality of liquid droplets with respect to the upper surface of the substrate only to an outer circumference side of the substrate in each of the center side spray cleaning step and the outer circumference side spray cleaning step. According to this configuration, it is possible to achieve the effect described above.

The substrate processing apparatus further includes an upper surface nozzle that discharges a rinse liquid toward an upper surface central portion of the substrate, and the controller further conducts an upper rinse liquid supplying step of causing the upper surface nozzle to discharge the rinse liquid toward the upper surface central portion of the substrate in parallel with the center side spray cleaning step and the outer circumference side spray cleaning step. According to this configuration, it is possible to achieve the effect described above.

The controller causes the nozzle moving mechanism to move the collision position of the plurality of liquid droplets with respect to the upper surface of the substrate between the middle of the substrate and the outer circumference of the substrate inside a region in which the upper surface of the substrate and the brush contact with each other in the outer circumference side spray cleaning step. According to this configuration, it is possible to achieve the effect described above.

The above and other objects, features, and effects of the present invention will become more apparent from the following detailed description of the preferred embodiments with reference to the attached drawings.

DESCRIPTION OF PREFERRED EMBODIMENTS

Figure 1:
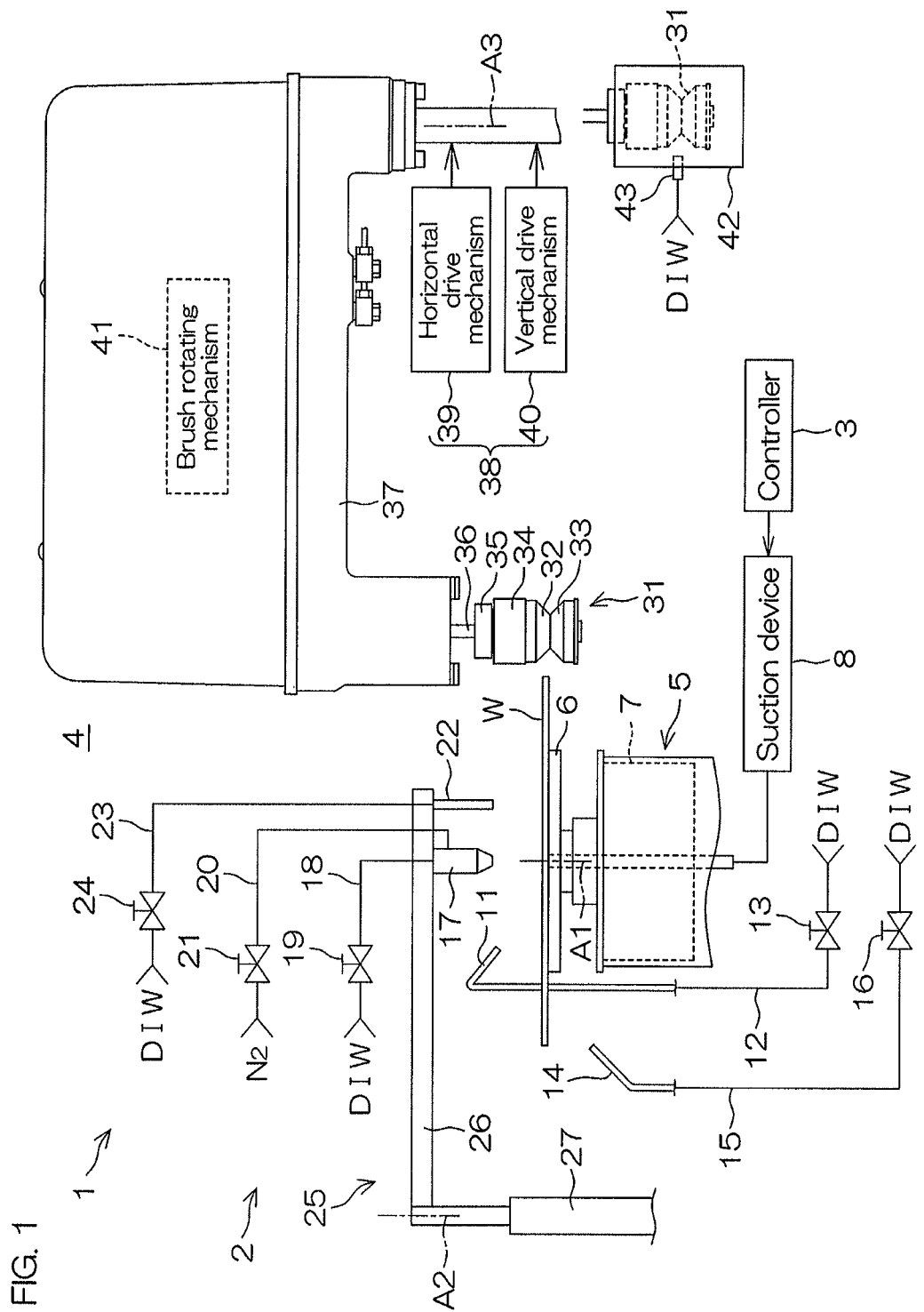
FIG. 1 is a schematic view of the interior of a processing unit included in a substrate processing apparatus according to a preferred embodiment of the present invention when viewed horizontally.
Figure 2:
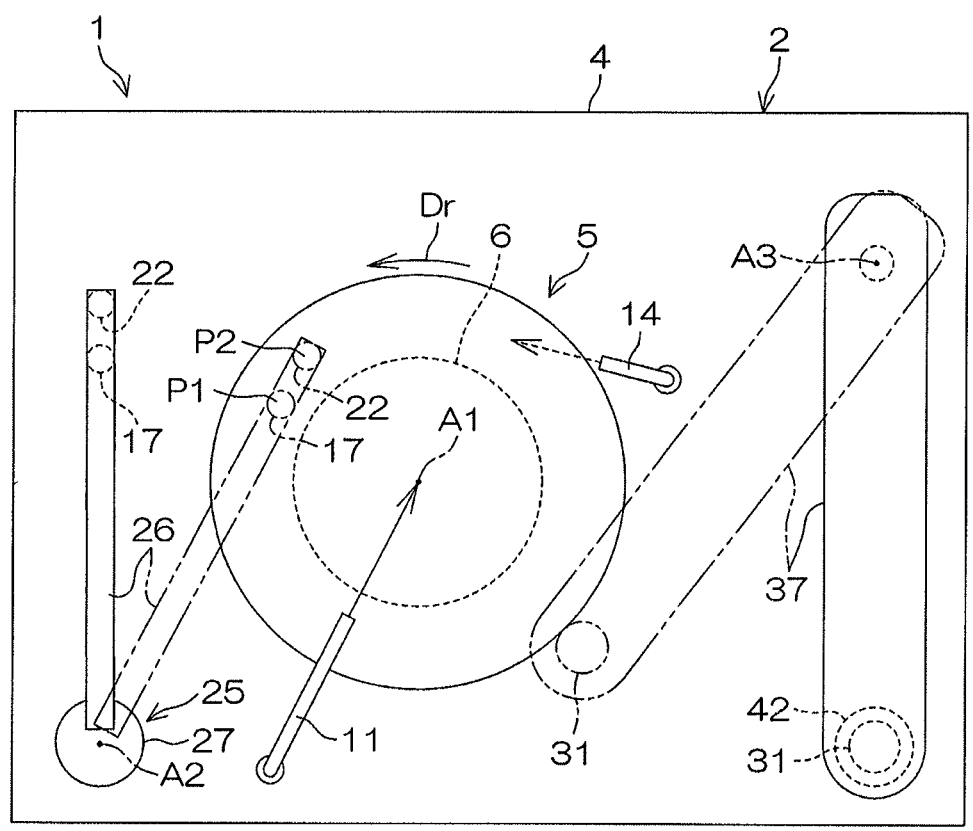
FIG. 2 is a schematic plan view of the processing unit.
Figure 3:
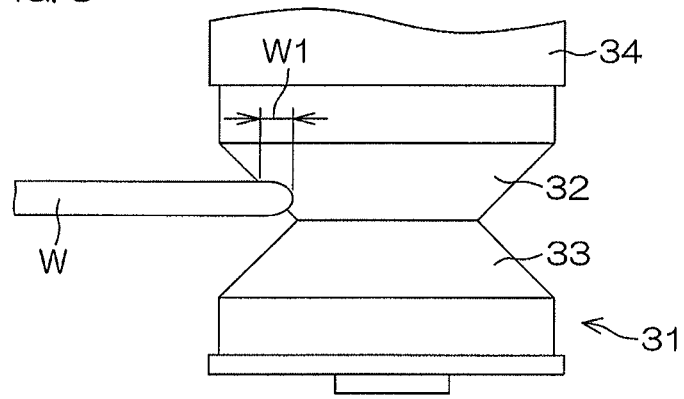
FIG. 3 is a schematic view of a brush pressed against the outer circumferential portion of the substrate as seen horizontally.

FIG. 1 is a schematic view of the interior of a processing unit 2 included in a substrate processing apparatus 1 according to a preferred embodiment of the present invention when viewed horizontally. FIG. 2 is a schematic plan view of the processing unit 2. FIG. 3 is a schematic view of a brush 31 pressed against the outer circumferential portion of a substrate W as seen horizontally.

As shown in FIG. 1, the substrate processing apparatus 1 is an apparatus that conducts spray cleaning and scrub cleaning to an upper surface and an outer circumferential portion of the disk-shaped substrate W such as semiconductor wafer. The substrate processing apparatus 1 includes the single substrate processing type processing unit 2 that processes the substrates W one by one, a transfer robot (not shown) that transfers the substrate W to the processing unit 2, and a controller 3 that controls the substrate processing apparatus 1. The controller 3 is a computer including an arithmetic portion and a storage portion.

The processing unit 2 includes a box-shaped chamber 4 that has an internal space, a spin chuck 5 that rotates the substrate W around a vertical rotation axis A1 passing through a central portion of the substrate W while holding the substrate W horizontally within the chamber 4 and a tubular cup (not shown) that receives a processing liquid discharged from the substrate W held by the spin chuck 5. The spin chuck 5 is an example of a substrate holding unit.

The spin chuck 5 includes a disc-shaped spin base 6 having an outer diameter smaller than that of the substrate W and a suction device 8 that causes the spin base 6 to hold the substrate W horizontally by causing a suction port that is open at an upper surface of the spin base 6 to adsorb onto a lower surface (rear surface) of the substrate W. The spin chuck 5 further includes a spin motor 7 that rotates the substrate W and the spin base 6 in a rotation direction Dr which is a direction around the rotation axis A1.

The processing unit 2 includes an upper surface nozzle 11 that discharges the processing liquid toward the upper central portion of the substrate W held by the spin chuck 5, and a lower surface nozzle 14 that discharges the processing liquid toward a position within the lower surface of the substrate W held by the spin chuck 5 and around the spin base 6. The upper surface nozzle 11 is connected to an upper surface pipe 12 in which an upper surface valve 13 is interposed. The lower surface nozzle 14 is connected to a lower surface pipe 15 in which a lower surface valve 16 is interposed.

When the upper surface valve 13 is opened, the process liquid is discharged from the upper surface nozzle 11, and then supplied to the upper surface of the substrate W. Similarly, the lower surface the valve 16 is opened, the process liquid is discharged from the lower nozzle 14, and then supplied to the lower surface of the substrate W. The processing liquid supplied to the upper surface nozzle 11 and lower surface nozzle 14 is pure water (deionized water), which is an example of the rinse liquid. The Rinse liquid is not limited to pure water and may be carbonated water, ionized water, ozone water, regenerated water (hydrogen water) or functional water (such as magnetic water). The processing liquid is not limited to the rinse liquid and may be a chemical liquid such as ammonia water and a mixed liquid of ammonia water and hydrogen peroxide. Different types of processing liquids may be supplied to the upper surface nozzle 11 and lower surface nozzle 14.

The processing unit 2 includes a spray nozzle 17 causes a plurality of liquid droplets to collide with the upper surface of the substrate W held by the spin chuck 5, a cover rinse liquid nozzle 22 that forms a liquid film to cover a collision position P1 (see FIG. 2) in the upper surface of the substrate W with which the plurality of liquid droplets collide and a nozzle moving mechanism 25 that moves the spray nozzle 17 and the cover rinse liquid nozzle 22.

The spray nozzle 17 is a two-fluid nozzle that generates a plurality of liquid droplets flying downward toward the upper surface of the substrate W by colliding liquid and gas its inside or its outside. The two-fluid nozzle includes a liquid ejection port for ejecting a liquid toward the upper surface of the substrate W and a gas ejection port for ejecting a gas that collides with the liquid ejected from the liquid ejection port. The spray nozzle 17 may simultaneously jet liquid from a plurality of holes to generate a plurality of liquid droplets. The plurality of liquid droplets generated by the spray nozzle 17 collide with the collision position P1 within the upper surface of the substrate W. The collision position P1 is, for example, a region in the upper surface of the substrate W covered by the spray nozzle 17 in a plan view.

When the spray nozzle 17 is a two-fluid nozzle, the spray nozzle 17 is connected to a liquid pipe 18 in which a liquid valve 19 interposed and connected to a gas pipe 20 in which a gas valve 21 is interposed. When the liquid valve 19 and the gas valve 21 are opened, liquid and gas are supplied to the spray nozzle 17, and a plurality of liquid droplets scattering downward toward the upper surface of the substrate W are generated. The liquid to be supplied to the spray nozzle 17 is pure water, and the gas to be supplied to the spray nozzle 17 is nitrogen gas. The liquid to be supplied to the spray nozzle 17 may be a processing liquid other than pure water. The gas to be supplied to the spray nozzle 17 may be an inert gas other than nitrogen gas.

The cover rinse liquid nozzle 22 is connected to a cover rinse liquid pipe 23 into which a cover rinse liquid valve 24 is interposed. When the cover rinse liquid valve 24 is opened, the cover rinse liquid is discharged from the cover rinse liquid nozzle 22 and supplied to the upper surface of the substrate W. The cover rinse liquid is pure water. The cover rinse liquid may be processing liquid other than water. The cover rinse liquid nozzle 22 discharges the cover rinsing liquid toward a liquid landing position P2 (see FIG. 2) in the upper surface of the substrate W. The cover rinse liquid that has landed on the liquid landing position P2 forms a liquid film covering the liquid landing position P2 and smaller than the substrate W. The liquid film formed on the rotating substrate W moves in a rotation direction Dr of the substrate W. With respect to the rotation direction Dr of the substrate W, the liquid landing position P2 is a position upstream of the collision position P1.

The nozzle moving mechanism 25 includes a nozzle arm 26 including a tip end portion to which the spray nozzle 17 and the cover rinse liquid nozzle 22 are attached and a nozzle horizontal drive mechanism 27 that moves the nozzle arm 26 horizontally along a path in which the tip end portion of the nozzle arm 26 passes through the center portion of the substrate W in a plan view. The nozzle horizontal drive mechanism 27 turns the nozzle arm 26 horizontally around a vertical nozzle rotation axis A2 located around the spin chuck 5 and the cup.

As shown in FIG. 2, the nozzle horizontal drive mechanism 27 horizontally moves the spray nozzle 17 and the cover rinse liquid nozzle 22 horizontally by turning the nozzle arm 26 horizontally. The nozzle horizontal drive mechanism 27 horizontally moves the spray nozzle 17 and the cover rinse liquid nozzle 22 between a processing position where the spray nozzle 17 and the cover rinsing liquid nozzle 22 are located above the substrate W and a standby position where the spray nozzle 17 and the cover rinsing liquid nozzle 22 are located around the spin chuck 5 and the cup in a plan view.

Since the spray nozzle 17 and the cover rinse solution nozzle 22 are held by the same nozzle arm 26, the liquid landing P2 and the collision position P1 are close to each other in the rotation direction Dr of the substrate W. With respect to the rotation direction Dr of the substrate W, the liquid landing P2 is a position upstream of the collision position P1. When the spray nozzle 17 generates a plurality of liquid droplets while the cover rinsing liquid nozzle 22 is discharging the cover rinsing liquid, the plurality of liquid droplets collide with the collision position P1 covered with the liquid film of the cover rinsing liquid As a result, the impact applied to the substrate W due to the collision of the liquid droplets is alleviated, so that the occurrence of pattern collapse is suppressed or prevented.

As shown in FIG. 1, the processing unit 2 includes a brush 31 to be pressed against the outer circumferential portion of the substrate W, a brush arm 37 that holds the brush 31 and a brush moving mechanism 38 that moves the brush 31 by moving the brush arm 37. The processing unit 2 may include a brush rotation mechanism 41 that is provided in the brush arm 37 and that rotates the brush 31 around a vertical center line of the brush 31 with respect to the brush arm 37.

The brush 31 is held by a brush holder 34 disposed above the brush 31. The brush holder 34 is attached to a holder attachment portion 35 disposed above the brush holder 34. The holder attachment portion 35 is supported by a support shaft 36 extending upward from the holder attachment portion 35. The support shaft 36 protrudes downward from the brush arm 37. When the brush rotation mechanism 41 is provided in the brush arm 37, the brush rotation mechanism 41 rotates the brush 31 by rotating the support shaft 36 about its center line.

As shown in FIG. 3, the brush 31 is an elastically deformable sponge brush made of a synthetic resin such as PVA (polyvinyl alcohol). The drum shaped brush 31 includes a truncated cone upper cleaning surface 32 which becomes thinner toward the lower end thereof and a truncated cone lower cleaning surface 33 which becomes thinner toward the upper end thereof. The upper cleaning surface 32 and the lower cleaning surface 33 are coupled at the lower end of the upper cleaning surface 32 and the upper end of the lower cleaning surface 33, and have shapes that are symmetrical with respect to a horizontal plane passing through the coupled portions of the upper cleaning surface 32 and the lower cleaning surface 33. The tapered upper cleaning surface 32 and the tapered lower cleaning surface 33 form an annular groove having a V-shaped cross section recessed toward a vertical center line of the brush 31.

As shown in FIG. 1, the brush moving mechanism 38 includes a brush horizontal drive mechanism 39 for horizontally moving the brush arm 37 and a brush vertical drive mechanism 40 for moving the brush arm 37 vertically. FIG. 2 shows an example in which the brush horizontal drive mechanism 39 is a brush turning mechanism for turning the brush arm 37 around a vertical brush rotation axis A3 located around the spin chuck 5 and the cup. The brush horizontal drive mechanism 39 may be a brush slide mechanism for moving the brush arm 37 horizontally in parallel.

The brush moving mechanism 38 moves the brush to a plurality of positions by moving the brush arm 37. The plurality of positions includes an upper cleaning position where the upper cleaning surface 32 of the brush 31 is pressed against the outer circumferential portion of the substrate W, a lower cleaning position where the lower cleaning surface 33 of the brush 31 is pressed against the outer circumferential portion of the substrate W, and a standby position where the brush 31 is located around the spin chuck 5 and the cup in a plan view. The plurality of positions further includes an upper proximity position where the upper cleaning surface 32 of the brush 31 faces the outer circumferential portion of the substrate W horizontally and a lower proximity position where the lower cleaning surface 33 of the brush 31 faces the outer circumferential portion of the substrate W horizontally.

The processing unit 2 includes a cylindrical pot 42 for accommodating the brush 31 located at the standby position and a cleaning liquid nozzle 43 for discharging pure water as an example of the cleaning liquid in the pot 42. When the brush moving mechanism 38 moves the brush 31 to the standby position, the brush 31 is accommodated in the pot 42. Foreign matters such as particles adhering to the brush 31 are removed by the pure water discharged from the cleaning liquid nozzle 43. The brush 31 located at the standby position is also maintained in a wet state by the pure water discharged from the cleaning liquid nozzle 43.

Figure 4:
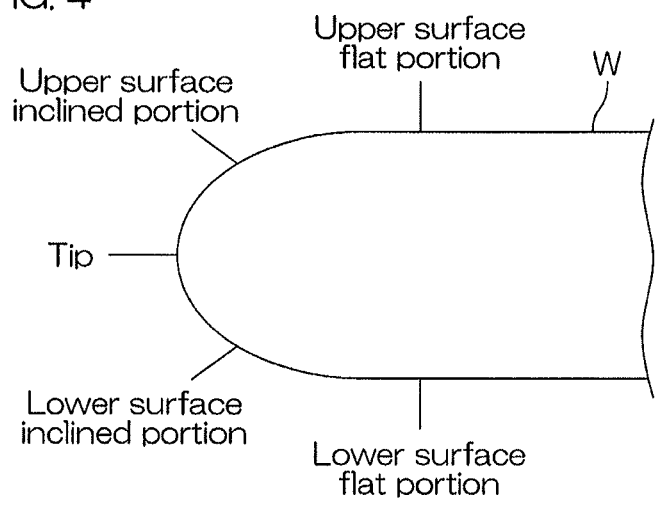
FIG. 4 is an enlarged view for explaining the outer circumferential portion of the substrate.

FIG. 4 is an enlarged view for explaining the outer circumferential portion of the substrate W. The upper surface of the substrate W includes a horizontal flat circular upper surface flat portion, and an annular upper surface inclined portion extending outwardly and obliquely downward from the outer end of the upper surface flat portion. Similarly, the lower surface of the substrate W includes a horizontal flat circular lower surface flat portion, and an annular lower surface inclined portion extending outwardly and obliquely upward from the outer end of the lower surface flat portion. The upper surface inclined portion and the lower surface inclined portion are inclined with respect to the upper surface flat portion and the lower surface flat portion. Annular tip of the substrate W extends from the outer end of the upper surface inclined portion to the outer end of the lower surface inclined portion.

The outer circumferential portion of the substrate W (so-called bevel portion) is a portion including the upper surface inclined portion, the tip and the lower surface inclined portion. FIG. 4 shows an example in which the outer circumferential portion of the substrate W includes a parabolic cross-section. The cross-section of the outer circumferential portion of the substrate W is not limited to a parabolic cross-section, and may be a trapezoidal cross-section. That is, each of the upper surface inclined portion, the tip and the lower surface inclined portion is not limited to have an arc-shaped cross section, or may have a linear cross-section. If the upper surface of the substrate W is a front surface that corresponds to a device forming surface, a portion of the upper surface flat portion corresponds to a device forming region. A non-device forming region is an annular region around the device forming region in the upper surface of the substrate W.

When the brush 31 is placed in the upper cleaning position (the position shown in FIG. 7), the upper cleaning surface 32 of the brush 31 is pressed against the outer circumferential portion of the substrate W, and the outer circumferential portion of the substrate W bites into the brush 31. Thus, the tip and the upper surface inclined portion of the substrate W come into contact with the brush 31. Similarly, when the brush 31 is placed in the lower cleaning position (the position shown in FIG. 6), the lower cleaning surface 33 of the brush 31 is pressed against the outer circumferential portion of the substrate W, and the outer circumferential portion of the substrate W bites into the brush 31. Thus, the tip and the lower surface inclined portion of the substrate W come into contact with the brush 31.

When the brush 31 is pressed against the outer circumferential portion of the rotating substrate W, the brush 31 is rubbed over the entire circumference of the substrate W. A cleaning width W1 (see FIG. 3) means a distance in the horizontal direction from the tip of the substrate W to the inner peripheral edge of the annular region where the brush 31 and the substrate W contact with each other. The cleaning width W1 is, for example, a value greater than 0 and less than or equal to 5 mm. The cleaning width W1 changes in accordance with the pressing force (or pressing amount) of the brush 31 against the substrate W. Depending on the pressing force of the brush 31 against the substrate W, the outer circumferential portions of the upper surface flat portion and the lower surface flat portion of the substrate W also contact the brush 31. The outer circumferential portion of the upper surface flat portion of the substrate W is a non-device forming region.

The control device 3 causes the substrate processing apparatus 1 to process the substrate W under processing conditions indicated in a recipe by controlling the substrate processing apparatus 1 based on the recipe indicating the processing conditions and processing procedures of the substrate W. The cleaning width W1 is indicated in the recipe. As described below, the control device 3 adjusts the pressing force or the pressing amount of the brush 31 against the substrate W by controlling at least one of the brush horizontal drive mechanism 39 and the brush vertical drive mechanism 40 based on the recipe. Thus, the outer circumferential portion of the substrate W is scrub cleaned with the cleaning width W1 indicated in the recipe.

Figure 5:
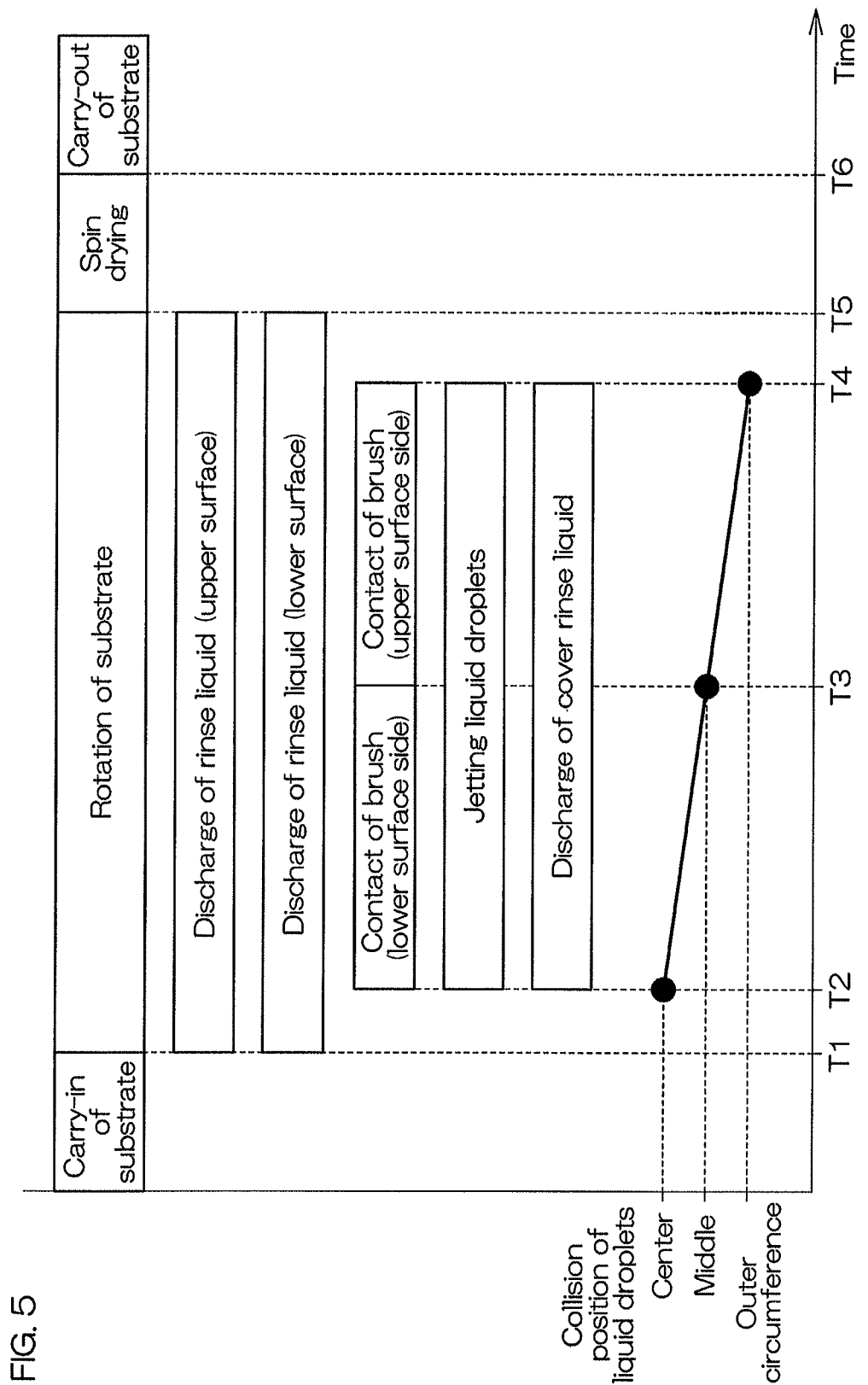
FIG. 5 is a time chart for explaining an example of processing of a substrate performed by the processing unit.

FIG. 5 is a time chart for explaining an example of processing of the substrate W performed by the processing unit 2.

In FIG. 5, the discharge of the rinsing liquid is drawn so as to start simultaneously with the rotation of the substrate W, but the discharge of the rinsing liquid may be started before or after the rotation of the substrate W is started. The same applies to other operations. The following operations are executed by the control device 3 controlling the substrate processing apparatus 1. The substrate W to be processed may be a substrate W on a front surface of which pattern is exposed or a substrate W in which pattern is not exposed.

When the substrate W is processed by the processing unit 2, a transfer robot (not shown) carries the substrate W on the hand into the chamber 4, and places the substrate W on the spin base 6 in a state where the front surface of the substrate W is directed upward. Thereafter, the suction device 8 of the spin chuck 5 causes the substrate W to be sucked on the spin base 6. Subsequently, the spin motor 7 starts rotating the substrate W and the spin base 6 (time T 1). As a result, the substrate W is rotated at a cleaning rate (for example, 100 to 300 rpm). Thereafter, the upper surface valve 13 and the lower surface valve 16 are opened, and the upper surface nozzle 11 and the lower surface nozzle 14 discharge pure water. As a result, supply of the pure water to the upper surface and the lower surface of the substrate W is started (time T 1).

Next, the brush moving mechanism 38 moves the brush 31 from the standby position to the lower proximity position. As a result, the lower cleaning surface 33 of the brush 31 horizontally faces the outer circumferential portion of the substrate W. Thereafter, the brush moving mechanism 38 horizontally moves the brush 31 toward the outer circumferential portion of the substrate W, thereby moving the brush 31 from the lower proximity position to the lower contact position. As a result, the lower cleaning surface 33 of the brush 31 is pressed against the outer circumferential portion of the substrate W (time T 2). While the lower cleaning surface 33 of the brush 31 is pressed against the outer circumferential portion of the substrate W, the brush 31 may be rotationally driven in the normal rotation direction or the reverse rotation direction, or may be fixed in the rotation direction of the brush 31.

When the lower cleaning surface 33 of the brush 31 is pressed against the outer circumferential portion of the substrate W, the outer circumferential portion of the substrate W bites into the lower cleaning surface 33, and the tip and lower surface inclined portion of the substrate W come into contact with the brush 31. At this time, the outer circumferential portion of the lower surface flat portion of the substrate W also contacts the brush 31. The brush 31 is rubbed against the entire circumference of the substrate W by the rotation of the substrate W. Therefore, the particles adhering to the lower surface inclined portion and the like of the substrate W are peeled off by the physical force from the brush 31. The peeled-off particles are rinsed off by the pure water supplied to the lower surface of the substrate W from the lower surface nozzle 14. As a result, the lower surface inclined portion and the like of the substrate W are cleaned.

On the other hand, the nozzle moving mechanism 25 moves the spray nozzle 17 and the cover rinse liquid nozzle 22 located at the standby position to a central position where the spray nozzle 17 faces the upper surface center portion of the substrate W. Thereafter, the cover rinse liquid valve 24 is opened, and the cover rinse liquid nozzle 22 discharges pure water (time T 2). Further, the gas valve 21 and the liquid valve 19 are opened, and the spray nozzle 17 ejects a plurality of liquid droplets toward the upper surface center portion of the substrate W (time T 2).

The plurality of liquid droplets sprayed from the spray nozzle 17 collide with the upper surface of the substrate W covered with the liquid film of pure water discharged from the cover rinsing liquid nozzle 22. Therefore, the particles adhering to the upper surface of the substrate W are peeled off by physical force due to collision of the liquid droplets. The peeled-off particles are rinsed off by the pure water supplied to the upper surface of the substrate W from the cover rinse liquid nozzle 22.

When the lower cleaning surface 33 of the brush 31 is pressed against the outer peripheral portion of the substrate W, the nozzle moving mechanism 25 moves the collision position of the plurality of liquid droplets with respect to the upper surface of the substrate W from the center of the substrate W toward the middle by moving the spray nozzle 17 horizontally (Time T 2-time T 3). The middle of the substrate W is, for example, a position where the radial distance from the center of the substrate W to the middle of the substrate W is ⅔ of the radius of the substrate W. The middle of the substrate W may be a position bisecting the radius of the substrate W or may be a position biased toward the center or the outer periphery of the substrate W. Alternatively, the middle of the substrate W may be set so that the area of the circular region from the center of the substrate W to the middle of the substrate W coincides with or substantially coincides with the area of the annular region from the middle of the substrate W to the outer circumference of the substrate W.

When the collision position of the plurality of liquid droplets in the upper surface of the substrate W reach the middle of the substrate W (time T 3), the nozzle moving mechanism 25 temporarily stops the movement of the spray nozzle 17. In this state, the brush moving mechanism 38 vertically lowers the brush 31 from the lower contact position to the upper contact position. As a result, the lower cleaning surface 33 of the brush 31 separates from the outer circumferential portion of the substrate W, and the upper cleaning surface 32 of the brush 31 is pressed against the outer circumferential portion of the substrate W (time T 3). While the upper cleaning surface 32 of the brush 31 is pressed against the outer circumferential portion of the substrate W, the brush 31 may be rotationally driven in the normal rotation direction or the reverse rotation direction, or may be fixed in the rotation direction of the brush 31.

When the upper cleaning surface 32 of the brush 31 is pressed against the outer circumferential portion of the substrate W, the outer circumferential portion of the substrate W bites into the upper cleaning surface 32, and the tip and the upper surface inclined portion of the substrate W come into contact with the brush 31. At this time, the outer circumferential portion of the upper surface flat portion of the substrate W also contacts the brush 31. The brush 31 is rubbed against the entire circumference of the substrate W by the rotation of the substrate W. Therefore, the particles adhering to the upper surface inclined portion and the like of the substrate W are peeled off by the physical force from the brush 31. The peeled-off particles are rinsed off by the pure water supplied to the upper surface of the substrate W from the upper surface nozzle 11. As a result, the upper surface inclined portion and the like of the substrate W are cleaned.

When the brush 31 moves to the upper contact position, the nozzle moving mechanism 25 moves the collision position of the plurality of liquid droplets with respect to the upper surface of the substrate W from the middle of the substrate W toward the outer circumference of the substrate W by moving the spray nozzle 17 and the cover rinse liquid nozzle 22 horizontally (time T 3-time T 4) When the spray nozzle 17 reaches the outer peripheral position in which the spray nozzle 17 faces the upper surface outer circumferential portion of the substrate W (time T 4), the gas valve 21 and the liquid valve 19 are closed, and the ejection of the liquid droplet from the spray nozzle 17 is stopped. Further, the cover rinse liquid valve 24 is closed, and the discharge of the pure water from the cover rinsing liquid nozzle 22 is stopped (time T 4). The outer circumference position is, for example, a position in which the collision position of the plurality of liquid droplets with respect to the upper surface of the substrate W is located before an annular area in which the upper surface of the substrate W and the brush 31 contact with each other (for example, 1 to 5 mm before). The nozzle moving mechanism 25 moves the spray nozzle 17 and the cover rinsing liquid nozzle 22 from the outer peripheral position to the standby position after stopping the ejection of the liquid droplets.

When the spray nozzle 17 reaches the outer peripheral position, the brush moving mechanism 38 horizontally moves the brush 31 from the upper contact position to the upper proximate position. As a result, the brush 31 is separated from the substrate W (time T 4). The brush moving mechanism 38 may move the brush 31 to the upper proximity position at the same time that the ejection of the liquid droplets from the spray nozzle 17 is stopped, or may move the brush 31 to the upper proximity position before or after the ejection of the liquid droplets is stopped. After the brush 31 moves to the upper proximity position, the brush moving mechanism 38 moves the brush 31 from the upper proximity position to the standby position.

The upper surface valve 13 and the lower surface valve 16 are closed after the ejection of the liquid droplets is stopped and the brush 31 is separated from the substrate W. As a result, the discharge of the pure water from the upper surface nozzle 11 and the lower surface nozzle 14 is stopped (time T 5). Thereafter, the spin motor 7 accelerates the substrate W in the rotation direction Dr and rotates the substrate W at a drying speed (for example, several thousands rpm) higher than the cleaning speed (time T 5-time T 6). As a result, the pure water adhering to the substrate W is shaken off around the substrate W, and the substrate W is dried.

When a predetermined time has elapsed since the high-speed rotation of the substrate W has started, the spin motor 7 stops the rotation of the substrate W (time T 6). Thereafter, the suction device 8 of the spin chuck 5 releases the suction of the substrate W to the spin base 6. Subsequently, the transfer robot (not shown) lifts up the substrate W on the spin base 6 by the hand, and carries the substrate W together with the hand from the chamber 4. As a result, the processed substrate W is unloaded from the chamber 4.

Figure 6:
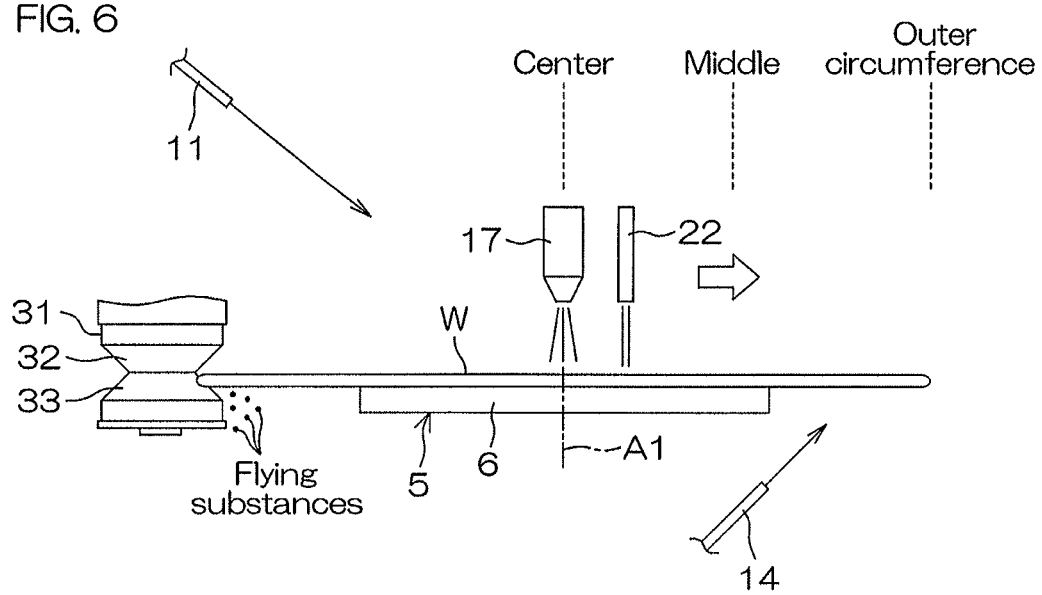
FIG. 6 is a schematic view for explaining the positions of the brush and the spray nozzle during processing of the substrate.
Figure 7:
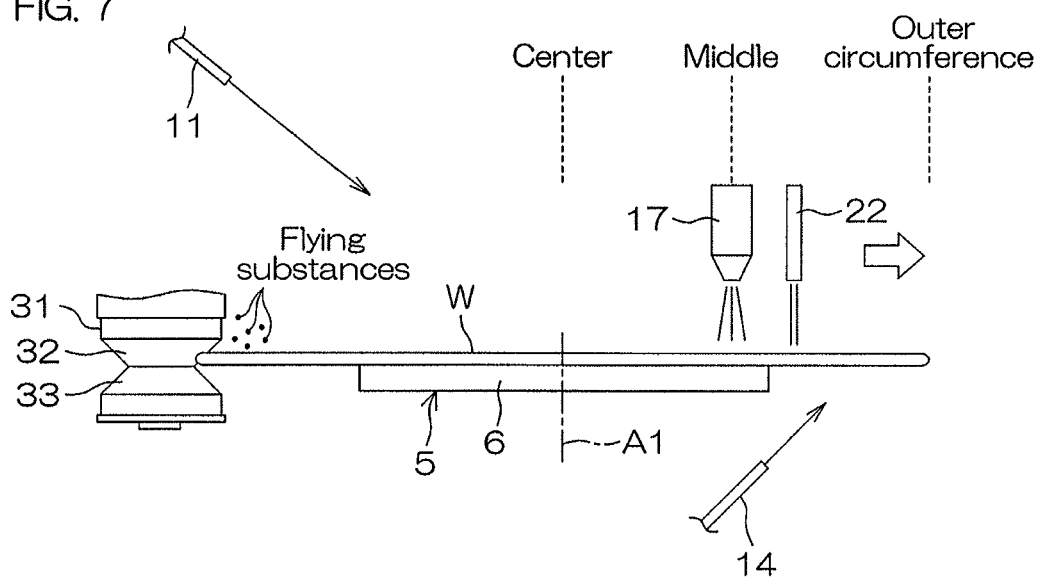
FIG. 7 is a schematic view for explaining the positions of the brush and the spray nozzle during processing of the substrate.

FIGS. 6 and 7 are schematic views for explaining the positions of the brush 31 and the spray nozzle 17 during processing of the substrate W.

As shown in FIG. 6, when the lower cleaning surface 33 of the brush 31 is pressed against the outer circumferential portion of the rotating substrate W, flying substances such as particles and liquid droplets scatter downwardly from the brush 31 toward the rotation axis A1 of the substrate W below the substrate W. Since these flying substances scatter in a direction away from the substrate W, they do not easily adhere to the substrate W. On the other hand, as shown in FIG. 7, when the upper cleaning surface 32 of the brush 31 is pressed against the outer circumferential portion of the rotating substrate W, flying substances scatter upward from the brush 31 toward the rotation axis A1 of the substrate W about the substrate W. The flying substances that have scattered upward fall onto the substrate W. Therefore, the flying substances tend to adhere to the upper surface of the substrate W, particularly the upper surface outer circumferential portion of the substrate W.

As described above, when the upper cleaning surface 32 of the brush 31 is pressed against the outer circumferential portion of the rotating substrate W, the spray nozzle 17 ejects the plurality of liquid droplets toward the outer circumferential portion of the upper surface of the substrate W, i.e., the area where the flying substances from the brush 31 are likely to fall. Therefore, even if the flying substances from the brush 31 adhere to the upper surface of the substrate W, the flying substances are immediately peeled off due to the collision of the liquid droplets. When the adhesion time of the flying substances to the substrate W becomes long, there is a case where the flying substances are fixed to the substrate W and it is difficult to remove them. Therefore, the flying substances can be reliably removed by causing liquid droplets to collide immediately with the flying substances adhering to the upper surface of the substrate W.

As described above, in the preferred embodiment, the brush 31 is brought into contact with the lower surface inclined portion of the rotating substrate W. Thus, the brush 31 is rubbed on the entire circumference of the lower surface of the substrate W. Foreign matters such as particles are peeled off from the substrate W by the physical force from the brush 31. In parallel with cleaning of the lower surface inclined portion of the substrate W, the plurality of liquid droplets collide with a region within the upper surface of the substrate W from the center of the substrate W to the middle of the substrate W. Foreign matters such as particles are peeled off from the substrate W by physical force due to collision of the liquid droplets.

After the lower surface inclined portion of the substrate W is cleaned, the brush 31 is brought into contact with the upper surface inclined portion of the rotating substrate W. Thus, the brush 31 is rubbed on the entire circumference of the upper surface of the substrate W. In parallel with the cleaning of the upper surface inclined portion of the substrate W, the plurality of liquid droplets collide with a region within the upper surface of the substrate W from the middle of the substrate W to the outer circumference of the substrate W. In this way, in parallel with the physical cleaning of the outer circumferential portion of the substrate W, the upper surface of the substrate W is cleaned physically, and thus it is possible to increase the cleanliness of the substrate W while suppressing an increase in cleaning time of the substrate W.

In addition, region on which flying substances tend to fall, that is, region in the upper surface of the substrate W from the middle of the substrate W to the outer circumference of the substrate W is cleaned with the plurality of liquid droplets when the brush 31 is in contact with the upper surface inclined portion of the substrate W. Thus, flying substances adhered to the upper surface of the substrate W can be immediately removed. In this way, not only foreign matter adhering to the upper surface outer circumferential portion of the upper surface of the substrate W, but also flying substances scattered from the brush 31 to the upper surface outer circumferential portion of the upper surface of the substrate W can be removed with the plurality of liquid droplets, and thus the cleanliness of the substrate W can be enhanced.

In the preferred embodiment, the collision position of the plurality of liquid drops with respect to the upper surface of the substrate W moves from the center of the substrate W to the middle of the substrate W, and then moves from the middle of the substrate W to the outer circumference of the substrate W. In this way, since the collision position moves only to the outer circumference side of the substrate W, a force to move foreign matters on the substrate W outward is generated. Therefore, foreign matters on the substrate W are urged to move outward along the upper surface of the substrate W. As a result, foreign matters can be efficiently removed from the substrate W and the cleanliness of the substrate W can be further enhanced.

In the preferred embodiment, when the spray nozzle 17 is jetting the plurality of liquid droplets toward the upper surface of the substrate W, the upper surface nozzle 11 discharges the rinse liquid toward the central portion of the upper surface of the substrate W. The rinse liquid that has landed on the upper surface of the substrate W flows outward along the upper surface of the substrate W. Foreign matters peeled off from the upper surface of the substrate W due to the collision of the plurality of liquid droplets are urged to move outward by the rinse liquid flowing outward. Thus, foreign matters can be efficiently removed from the substrate W and the cleanliness of the substrate W can be further enhanced.

In the preferred embodiment, the collision position of the plurality of liquid drops with respect to the upper surface of the substrate W moves inside the region in which the upper surface of the substrate W and the brush 31 contact with each other. That is, the scrub cleaning (cleaning with a brush 31) and spray cleaning (cleaning by a collision of the liquid droplets) is carried out in separate regions of the substrate W. In this way, the scrub cleaning and the spray cleaning are not performed to the same region of the substrate W, so that cleaning time of the substrate W can be shortened.

OTHER PREFERRED EMBODIMENTS

The present invention is not restricted to the contents of the preferred embodiments described above and various modifications are possible within the scope of the present invention.

For example, the brush 31 is not limited to a sponge brush, or may be a brush having a plurality of fibers made of synthetic resin.

The case where the collision position of the plurality of liquid droplets with respect to the upper surface of the substrate W is moved only to the outer peripheral side of the substrate W has been described, however, the collision position may be moved to both the center side and the outer circumference side of the substrate W.

The case where the upper surface nozzle 11 and the lower surface nozzle 14 discharge the pure water over the entire period during which the spray nozzle 17 is spraying the plurality of liquid droplets has been described, however, at least one of the upper surface nozzle 11 and the lower surface nozzle 14 may stop discharging the pure water in a part of the period during which the spray nozzle 17 is spraying the plurality of liquid droplets. For example, at least one of the upper surface nozzle 11 and the lower surface nozzle 14 may stop discharging the pure water, while the collision position of the plurality of liquid droplets with respect to the upper surface of the substrate W is positioned between the middle of the substrate W and the outer circumference of the substrate W.

The case where the cover rinsing liquid nozzle 22 discharges the pure water over the entire period in which the spray nozzle 17 is spraying the plurality of liquid droplets has been described, however, the cover rinse liquid nozzle 22 may stop the discharge of the pure water in a part of the period during which the spray nozzle 17 is spraying the plurality of liquid droplets. For example, while the collision position of the plurality of liquid droplets with respect to the upper surface of the substrate W is positioned between the middle of the substrate W and the outer circumference of the substrate W, the cover rinsing liquid nozzle 22 may stop discharging the pure water. The cover rinse liquid nozzle 22 may also be omitted.

The case in which the scrub cleaning area where the scrub cleaning is performed and the spray cleaning area where the spray cleaning is performed do not overlap with each other has been described, however, the scrub cleaning area and the spray cleaning area may partially overlap each other. For example, the spray nozzle 17 may be moved until the collision position of a plurality of liquid droplets with respect to the upper surface of the substrate W reaches the tip of the substrate W.

The case where the movement of the spray nozzle 17 is temporarily stopped when the brush 31 is moved from the lower contact position to the upper contact position has been described, however, the brush 31 may be moved from the lower contact position to the upper contact position while moving the spray nozzle 17.

In FIG. 5, the moving speed of the collision position of the plurality of liquid drops with respect to the upper surface of the substrate W is shown to be constant, however, the moving speed of the collision position may not be constant.

Two or more of any of the arrangements described above may be combined. Two or more of any of the steps described above may be combined.

The present application corresponds to Japanese Patent Application No. 2015-189833 filed on Sep. 28, 2015 in the Japan Patent Office, and the entire disclosure of this application is incorporated herein by reference. While preferred embodiments of the present invention have been described in detail, it should be understood that these embodiments are merely illustrative of the technical principles of the present invention but not limitative of the invention. The spirit and scope of the present invention are to be limited only by the appended claims.

DESCRIPTION OF THE REFERENCE NUMERALS

1: Substrate processing apparatus
2: The processing unit
3: Control unit
4: Chamber
5: Spin chuck (substrate holding unit)
6: Spin base
7: Spin motor
8: Suction device
11: Upper surface nozzle
12: Upper surface pipe
13: Upper surface valve
14: Lower surface nozzle
15: Lower surface pipe
16: Lower surface valve
17: Spray nozzle
18: Liquid pipe
19: Liquid valve
20: Gas pipe
21: Gas valve
22: Cover rinse liquid nozzle
23: Cover rinse liquid pipe
24: Cover rinse liquid valve
25: Nozzle moving mechanism
26: Nozzle arm
27: Nozzle horizontal drive mechanism
31: Brush
32: Upper cleaning surface
33: Lower cleaning surface
34: Brush holder
35: Holder attachment portion
36: Supporting shaft
37: Brush arm
38: Brush moving mechanism
39: Brush horizontal drive mechanism
40: Brush vertical drive mechanism
41: Brush rotating mechanism
42: Pot
43: Cleaning liquid nozzle
A1: Rotation axis
A2: Nozzle rotation axis
A3: Brush rotation axis
Dr: Rotation Direction
P1: Collision position
P2: Liquid landing position
W: Substrate
W1: Cleaning width

What is claimed is:

1. A substrate processing method comprising:
a substrate rotating step of rotating a substrate about a vertical rotation axis passing through the substrate while holding the substrate horizontally;
a lower side scrub cleaning step of causing a brush to come into contact with a lower surface inclined portion of the substrate, in parallel with the substrate rotating step;
a center side spray cleaning step of moving a collision position of a plurality of liquid droplets with respect to an upper surface of the substrate between a center of the substrate and a middle of the substrate while causing the plurality of liquid droplets to collide with the upper surface of the substrate, in parallel with the lower side scrub cleaning step;
an upper side scrub cleaning step of causing the brush to come into contact with an upper surface inclined portion of the substrate, after the lower side scrub cleaning step and in parallel with the substrate rotating step; and
an outer circumference side spray cleaning step of moving the collision position of the plurality of liquid droplets with respect to the upper surface of the substrate between the middle of the substrate and an outer circumference of the substrate while causing the plurality of liquid droplets to collide with the upper surface of the substrate, in parallel with the upper side scrub cleaning step.

2. The substrate processing method according to claim 1, wherein each of the center side spray cleaning step and the outer circumference side spray cleaning step is a step of moving the collision position of the plurality of liquid droplets with respect to the upper surface of the substrate only to an outer circumference side of the substrate.

3. The substrate processing method according to claim 1, further comprising:
an upper rinse liquid supplying step of discharging a rinse liquid toward an upper surface central portion of the substrate in parallel with the center side spray cleaning step and the outer circumference side spray cleaning step.

4. The substrate processing method according to claim 1, wherein
the outer circumference side spray cleaning step is a step of moving the collision position of the plurality of liquid droplets with respect to the upper surface of the substrate between the middle of the substrate and the outer circumference of the substrate inside a region in which the upper surface of the substrate and the brush contact with each other.

5. A substrate processing apparatus comprising:
a substrate holding unit that rotates a substrate about a vertical rotation axis passing through the substrate while holding the substrate horizontally;
a brush to be pressed against the substrate;
a brush moving mechanism that moves the brush to a plurality of positions including a lower contact position in which the brush contacts with a lower surface inclined portion of the substrate and an upper contact position in which the brush contacts with an upper surface inclined portion of the substrate;
a nozzle that forms a plurality of liquid droplets that collide with an upper surface of the substrate;
a nozzle moving mechanism that moves a collision position of the plurality of liquid droplets with respect to the upper surface of the substrate between a center of the substrate and an outer circumference of the substrate; and
a controller that controls the substrate holding unit, the brush moving mechanism and the nozzle moving mechanism,
wherein the controller conducts:
a substrate rotating step of causing the substrate holding unit to hold the substrate horizontally and to rotate the substrate about the rotation axis;
a lower side scrub cleaning step of causing the brush moving mechanism to bring the brush into contact with the lower surface inclined portion of the substrate, in parallel with the substrate rotating step;
a center side spray cleaning step of causing the nozzle moving mechanism to move the collision position of the plurality of liquid droplets with respect to the upper surface of the substrate between the center of the substrate and a middle of the substrate while causing the plurality of liquid droplets to collide with the upper surface of the substrate, in parallel with the lower side scrub cleaning step;
an upper side scrub cleaning step of causing the brush moving mechanism to bring the brush to come into contact with the upper surface inclined portion of the substrate, after the lower side scrub cleaning step and in parallel with the substrate rotating step; and
an outer circumference side spray cleaning step of causing the nozzle moving mechanism to move the collision position of the plurality of liquid droplets with respect to the upper surface of the substrate between the middle of the substrate and the outer circumference of the substrate while causing the plurality of liquid droplets to collide with the upper surface of the substrate, in parallel with the upper side scrub cleaning step.

6. The substrate processing apparatus according to claim 5, wherein
the controller moves the collision position of the plurality of liquid droplets with respect to the upper surface of the substrate only to an outer circumference side of the substrate in each of the center side spray cleaning step and the outer circumference side spray cleaning step.

7. The substrate processing apparatus according to claim 5, wherein
the substrate processing apparatus further comprises an upper surface nozzle that discharges a rinse liquid toward an upper surface central portion of the substrate, and
the controller further conducts an upper rinse liquid supplying step of causing the upper surface nozzle to discharge the rinse liquid toward the upper surface central portion of the substrate in parallel with the center side spray cleaning step and the outer circumference side spray cleaning step.

8. The substrate processing apparatus according to claim 5, wherein
the controller causes the nozzle moving mechanism to move the collision position of the plurality of liquid droplets with respect to the upper surface of the substrate between the middle of the substrate and the outer circumference of the substrate inside a region in which the upper surface of the substrate and the brush contact with each other in the outer circumference side spray cleaning step.

9. The substrate processing method according to claim 2, further comprising:
an upper rinse liquid supplying step of discharging a rinse liquid toward an upper surface central portion of the substrate in parallel with the center side spray cleaning step and the outer circumference side spray cleaning step.

10. The substrate processing method according to claim 9, wherein
the outer circumference side spray cleaning step is a step of moving the collision position of the plurality of liquid droplets with respect to the upper surface of the substrate between the middle of the substrate and the outer circumference of the substrate inside a region in which the upper surface of the substrate and the brush contact with each other.

11. The substrate processing method according to claim 2, wherein
the outer circumference side spray cleaning step is a step of moving the collision position of the plurality of liquid droplets with respect to the upper surface of the substrate between the middle of the substrate and the outer circumference of the substrate inside a region in which the upper surface of the substrate and the brush contact with each other.

12. The substrate processing apparatus according to claim 6, wherein
the substrate processing apparatus further comprises an upper surface nozzle that discharges a rinse liquid toward an upper surface central portion of the substrate, and
the controller further conducts an upper rinse liquid supplying step of causing the upper surface nozzle to discharge the rinse liquid toward the upper surface central portion of the substrate in parallel with the center side spray cleaning step and the outer circumference side spray cleaning step.

13. The substrate processing apparatus according to claim 12, wherein
the controller causes the nozzle moving mechanism to move the collision position of the plurality of liquid droplets with respect to the upper surface of the substrate between the middle of the substrate and the outer circumference of the substrate inside a region in which the upper surface of the substrate and the brush contact with each other in the outer circumference side spray cleaning step.

14. The substrate processing apparatus according to claim 7, wherein
the controller causes the nozzle moving mechanism to move the collision position of the plurality of liquid droplets with respect to the upper surface of the substrate between the middle of the substrate and the outer circumference of the substrate inside a region in which the upper surface of the substrate and the brush contact with each other in the outer circumference side spray cleaning step.

* * * * *